United States Patent
Delaunay et al.

(10) Patent No.: US 7,303,790 B2
(45) Date of Patent: *Dec. 4, 2007

(54) ELECTRON CYCLOTRON RESONANCE PLASMA DEPOSITION PROCESS AND DEVICE FOR SINGLE-WALL CARBON NANOTUBES AND NANOTUBES THUS OBTAINED

(75) Inventors: Marc Delaunay, Meylan (FR); Cyril Vannufel, Grenoble (FR)

(73) Assignee: Commissariat A l'Energie Atomique, Paris (FR)

( * ) Notice: Subject to any disclaimer, the term of this patent is extended or adjusted under 35 U.S.C. 154(b) by 416 days.

This patent is subject to a terminal disclaimer.

(21) Appl. No.: 10/399,175

(22) PCT Filed: Oct. 26, 2001

(86) PCT No.: PCT/FR01/03334

§ 371 (c)(1), (2), (4) Date: Apr. 15, 2003

(87) PCT Pub. No.: WO02/34669

PCT Pub. Date: May 2, 2002

(65) Prior Publication Data

US 2004/0011291 A1    Jan. 22, 2004

(51) Int. Cl.
*H05H 1/16* (2006.01)
*H05H 1/18* (2006.01)
*H05H 1/46* (2006.01)
*C23C 16/23* (2006.01)
*C23C 16/511* (2006.01)

(52) U.S. Cl. ............ 427/571; 427/573; 427/577; 427/575; 427/249.1; 423/447.3

(58) Field of Classification Search .......... 427/571, 427/573, 575, 577, 249.1, 249.6, 255.23, 427/180, 903; 977/DIG. 1; 423/447.3, 445 B; 118/723 MR, 723 MA
See application file for complete search history.

(56) References Cited

U.S. PATENT DOCUMENTS 4,638,216 A * 1/1987 Delaunay et al. ....... 315/111.81

(Continued)

FOREIGN PATENT DOCUMENTS

EP        0 932 183 A1    7/1999

(Continued)

OTHER PUBLICATIONS

Thess, et al., "Crystalline Ropes of Metallic Carbon Nanotubes", Science, vol. 273, pp. 483-487 (Jul. 26, 1996).

(Continued)

*Primary Examiner*—Marianne Padgett
(74) *Attorney, Agent, or Firm*—McKenna Long & Aldridge LLP

(57) ABSTRACT

Electron cyclotron resonance plasma deposition process and device for single-wall carbon nanotubes (SWNTs) on a catalyst-free substrate, by injection of microwave power into a deposition chamber comprising a magnetic confinement structure with a magnetic mirror, and at least one electron cyclotron resonance area inside or at the border of the deposition chamber and facing the substrate, whereby dissociation and/or ionization of a gas containing carbon is caused, at a pressure of less than $10^{-3}$ mbars, in the magnetic mirror at the center of the deposition chamber, producing species that will be deposited on said heated substrate. The substrate surface includes raised and/or lowered reliefs. The invention concerns the SWNTs thus obtained.

16 Claims, 5 Drawing Sheets

U.S. PATENT DOCUMENTS

| | | | |
|---|---|---|---|
| 6,097,138 A * | 8/2000 | Nakamoto | 313/309 |
| 6,277,318 B1 * | 8/2001 | Bower et al. | 264/346 |
| 6,319,372 B1 | 11/2001 | Delaunay | |
| 6,337,110 B1 | 1/2002 | Delaunay et al. | |
| 6,346,303 B1 * | 2/2002 | Shih et al. | 427/571 |
| 6,420,092 B1 * | 7/2002 | Yang et al. | 430/311 |
| 6,495,258 B1 * | 12/2002 | Chen et al. | 428/408 |
| 6,522,055 B2 * | 2/2003 | Uemura et al. | 313/310 |
| 6,787,200 B1 * | 9/2004 | Delaunay et al. | 427/571 |
| 6,946,780 B2 * | 9/2005 | Hosono et al. | 313/310 |
| 6,991,949 B2 * | 1/2006 | Muroyama et al. | 438/20 |
| 7,067,237 B2 * | 6/2006 | Kim et al. | 430/315 |
| 7,091,084 B2 * | 8/2006 | Kellar et al. | 438/255 |
| 7,094,679 B1 * | 8/2006 | Li et al. | 438/618 |
| 7,160,585 B2 * | 1/2007 | Delaunay et al. | 427/571 |
| 2003/0059968 A1 * | 3/2003 | Cheng et al. | 438/20 |
| 2006/0078680 A1 * | 4/2006 | Nakano et al. | 427/249.1 |
| 2006/0119921 A1 * | 6/2006 | Kinoshita et al. | 359/241 |
| 2006/0181854 A1 * | 8/2006 | Freedman | 361/705 |

FOREIGN PATENT DOCUMENTS

| | | |
|---|---|---|
| EP | 0 967 844 A1 | 12/1999 |
| JP | 2001-192829 A * | 7/2001 |
| WO | 01/03158 A1 | 1/2001 |

OTHER PUBLICATIONS

Journet, et al., "Large-scale production of single-walled carbon nanotubes by the electric-arc technique", Nature, vol. 388, pp. 756-758 (Aug. 21, 1997).

Delaunay, "Electron cyclotron resonance plasma ion source for material depositions", Review of Scientific Instruments, American Institute of Physics, vol. 69, No. 6, pp. 2320-2324 (Jun. 1998).

Saito, et al., "High Yield of single-wall carbon nanotubes by arc discharge using Rh-Pt mixed catalysts", Chemical Physics Letters, 294, pp. 593-598 (Sep. 25, 1998).

Kong, et al., "Synthesis of individual single-walled carbon nanotubes on patterned silicon wafers", Nature, vol. 395, pp. 878-881 (Oct. 29, 1998).

Sung, et al., "Well-aligned carbon nitride nanotubes synthesized in anodic alumina by electron cyclotron resonance chemical vapor deposition", American Institute of Physics, vol. 74, No. 2, 3 pages, Jan. 11, 1999.

Liu, et al., "Hydrogen Storage in Single-Walled Carbon Nanotubes at Room Temperature", Science, http://www.sciencemag.org/cgi/content/full/286/5442/1127, 8 pages, May 11, 1997.

Cassell, et al., "Large Scale CVD Synthesis of Single-Walled Carbon Nanotubes", J. Phys. Chem., 3, pp. 6484-6492, 1999.

Nikolaev, et al., "Gas-phase catalytic growth of single-walled carbon nanotubes from carbon monoxide", Chemical Physics Letter, 313, pp. 91-97, Nov. 5, 1999.

Dean, et al., "The environmental stability of field emission from single-walled carbon nanotubes", Applied Physics Letters, vol. 75, No. 19, pp. 3017-3019, Nov. 8, 1999.

Hoshi, et al., Database Inspection—Online, "Field emission and structure of aligned carbon nanofibers deposited by ECR-CVD plasma method", Institute of Electrical Engineers, Stevenage, Great Britain, Abstract No. XP 002171730 (2000).

Tsai, et al., "Synthesis and characterization of the aligned hydrogenated amorphous carbon nanotubes by electron cyclotron resonance excitation", Thin Solid Flims, 366, pp. 11-15, 2000.

* cited by examiner

ELECTRON CYCLOTRON RESONANCE PLASMA DEPOSITION PROCESS AND DEVICE FOR SINGLE-WALL CARBON NANOTUBES AND NANOTUBES THUS OBTAINED

DESCRIPTION

This invention relates to a process and a device for electron cyclotron resonance plasma deposition of single-wall carbon nanotubes.

The invention also relates to single-wall nanotubes thus obtained.

In general, the technical field of this application may be defined as being the technique for deposition of carbon layers on a substrate.

In this application, we will be specifically interested in the preparation of deposits or layers of carbon formed of nanotubes or nanofibers and in particular, in the preparation of Single-wall carbon NanoTubes (SWNTs).

Carbon nanotubes may be classified in two main categories; firstly multi-wall nanotubes, and secondly single-wall nanotubes. These two categories of nanotubes form two distinct types of materials, both for the structure and for synthesis.

FIG. 1A shows an example of a multi-wall carbon nanotube which comprises several concentric tubes one inside the other, the first tube has a diameter of 7 to 10 nm and the total diameter of the multi-wall nanotube, that may contain between two and several tens of tubes, can vary from 4 to several tens of nm, for example 30 nm.

FIG. 1B shows a single-wall carbon nanotube on a substrate.

Single-wall carbon nanotubes (SWNTs) have a diameter of about 1 nm and are frequently grouped into bundles.

Since S. IJIMA discovered carbon nanotubes in 1991, major efforts have been made to synthesize carbon nanotubes, and particularly single-wall nanotubes, for many applications such as nanoelectronics with nanoconductor networks [1], hydrogen storage for fuel cells [2], electron emitters by flat screens [3], or other applications that benefit from the excellent mechanical properties of nanotubes and the fact that they may be metallic or semiconducting.

Architectures developed from graphene planes such as nanotubes and fullerenes are intermediate between existing architectures such as silicon micro-electronics and polymers, and organic molecules and biological carbon chains, have a great deal of potential for building nanosystems. The most promising example is the production of neuron type networks [1] and grafting of organic and biological molecules.

Compared with multi-wall carbon nanotubes, in microelectronics single-wall nanotubes have the advantage that they are better defined to obtain the same properties.

High quality single-wall nanotubes are necessary for fundamental and technological applications; high quality nanotubes mean nanotubes without any chemical or structural defects or impurities, such as graphitic crystals or amorphous phases over a significant length along the centerline of a tube.

Table I at the end of this description displays different devices and processes for the deposition of single-wall carbon nanotubes.

The main processes used to manufacture single-wall carbon nanotubes use an electric arc and laser ablation with graphite, with Fe, Co, Ni, Rh and Pt type catalysts.

Thus, document [2] describes the preparation of single-wall carbon nanotubes by synthesis with a hydrogen arc discharge on a substrate provided with a catalyst formed from Ni, Co and Fe, and $Fe_2S$ powders as a growth trigger. The nanotubes prepared are in the form of interlocking bundles with a diameter of about 20 nm, comprising about 40% of catalyst.

Document [5] describes how single-wall carbon nanotubes may be made by arc evaporation in helium, using binary mixes of metals in the platinum group as a catalyst. The production efficiency of SWNTs is very much improved when a non-magnetic Rh—Pt catalyst is used.

Document [6] mentions that single-wall carbon nanotubes may be produced with a higher efficiency than by arc discharge, by making a laser evaporation of a graphite rod, and improves this technique by making single-wall carbon nanotubes with efficiencies of more than 70% by condensation of a mix of carbon-nickel-cobalt evaporated by laser at 1200° C. The "SWNTs" obtained have a uniform diameter close to about 1.4 nm and they are organized into ropes or bundles containing 100 to 500 SWNTs in a two dimensional triangular network.

Finally, document [4] shows that the electric arc technique preferably used to generate fullerenes and multi-wall nanotubes is less expensive and easier to implement, but leads to low efficiencies of single-wall carbon nanotubes and can give large quantities of "SWNTs" for which the characteristics are similar to the characteristics of nanotubes obtained by laser ablation. This document uses a Ni—Co catalyst that preferably also contains yttrium which leads to the formation of structures similar to interlocking filaments or bundles comprising about 20 nanotubes, and spherical nanoparticles of a catalyst with a diameter varying from 3 to 20 nm.

There are many disadvantages with electric arc discharge processes and laser ablation processes.

These two processes involve the evaporation of carbon atoms starting from solid carbon sources at very high temperatures, which imposes a limit to the quantity of nanotubes that can be synthesized, and furthermore these evaporation processes make nanotubes grow in a highly interlocking form with the formation of parasite species of carbon or metal. Single-wall carbon nanotubes are difficult to purify (soot) and to manipulate, and in particular it is not easy to collect them on graphite electrodes. Finally, these nanotubes cannot easily be assembled to build the architecture of nanotube devices.

Furthermore, it is known that chemical vapor deposition (CVD) of hydrocarbons on metallic catalysts is a classical process to produce carbonated materials. Various forms of carbon fibers, filaments and multi-wall nanotubes have been synthesized by CVD.

Concerning the deposition of single-wall carbon nanotubes, document [1] describes the synthesis of single-wall carbon nanotubes on silicon wafers with catalytic patterns in the form of micrometrically sized islands of Fe, Mo, by CVD of methane.

The process consists of heating the patterned substrate in a furnace to a temperature of 1000° C. under an argon atmosphere and then replacing the argon by methane kept at the same temperature for 10 minutes. The prepared nanotubes are individual single-wall nanotubes with diameters varying from 1 to 3 nm and lengths of a few tens of μm.

Document [8] describes a process for the preparation of SWNTs by gaseous phase catalysis, in which the catalysts are formed in situ by thermal decomposition of pentacarbonyl iron in a current of carbon monoxide heated to between 800 and 1200° C. The result is single-wall carbon nanotubes with a limiting diameter less than or equal to 0.7 nm, and on average of the order of 1.2 nm.

Document [7] relates to the synthesis of single-wall carbon nanotubes by CVD, using methane at about 900° C. as the carbonated charge, on substrates provided with a catalyst pattern. The result is thus highly efficient single-wall nanotubes in the form of individual tubes or bundles. The best results are obtained with Fe/Mo bimetallic catalysts on a silica-alumina support.

All CVD processes described above have the advantage of depositing single-wall carbon nanotubes directly on substrates, but they are done at high temperature, usually close to 800-1200° C. which is therefore incompatible with many substrates such as glass. Furthermore, the depositions compulsorily include islands of catalyst, as for arc or laser ablation processes.

Other processes (CVD) using filaments and microwaves with methane diluted in hydrogen at several tens of millibars, can only be used to prepare multi-wall nanotubes.

Electron cyclotron resonance plasma sources with high magnetic confinement can be used to generate plasma at low pressure with high-energy electrons. It is thus possible to strongly dissociate organic molecules, for example of methane or acetylene, to make depositions and particularly graphitic depositions.

Thus, document [9] describes the plasma deposition of DLC (Diamond Like Carbon) type films from a methane-hydrogen mix, by electron cyclotron resonance.

Document [10] describes a linear microwave plasma source with permanent currents.

Document [11] deals with a process for electron cyclotron resonance plasma deposition of electron emitting carbon layers.

Single-wall carbon nanotubes (SWNTs) have never yet been successfully formed by electron cyclotron resonance plasma processes.

Finally, none of the processes described above can be used for the deposition of single-wall carbon nanotubes without a catalyst over large areas, in other words generally greater than or equal to 1 $m^2$.

Therefore, there is a need for a process for deposition of single-wall carbon nanotubes that does not necessitate catalyst, that enables deposition of these nanotubes at a relatively low temperature (for example of about 600 to 700° C.) on large areas and on all types of substrates.

Therefore, the purpose of this invention is to provide a process for the deposition of single-wall carbon nanotubes that, among others, satisfies all needs mentioned above.

The purpose of this invention is also to provide a process for the deposition of single-wall carbon nanotubes that does not have the disadvantages, defects, limitations and disadvantages of processes according to prior art and that solves the problems according to prior art.

According to this invention, this and other purposes are achieved by an electron cyclotron resonance plasma deposition process for single-wall carbon nanotubes on a catalyst-free substrate, by injection of a microwave power in a deposition chamber comprising a magnetic confinement structure with a magnetic mirror, and at least one electron cyclotron resonance area inside or at the border of said deposition chamber and facing said substrate, whereby dissociation and/or ionization of a gas containing carbon is caused, at a pressure of less than $10^{-3}$ mbars, in said magnetic mirror to the rest of the deposition chamber, producing species that will be deposited on said heated substrate; process in which the substrate surface includes raised and/or lowered reliefs.

Advantageously, these raised and/or lowered reliefs comprise at least one surface approximately perpendicular to the main plane of the substrate surface, advantageously to obtain growth of single-wall nanotubes approximately perpendicular to the main plane of the substrate surface.

It is also possible for the raised and/or lowered reliefs to have a concave or convex curved or curvilinear shape.

More precisely, the process for deposition comprises the following steps:
  heating the substrate;
  creating a pressure of less than or equal to $10^{-3}$ mbars, in of gas containing carbon;
  injection of the microwave power and creation of the plasma from said gas containing carbon, for a value of the magnetic field corresponding to electron cyclotron resonance;
  creation of a potential difference between the plasma and the substrate;
  dissociation and/or ionization of molecules in said magnetic mirror at the center of the deposition chamber;
  deposition of the formed species on said substrate to obtain single-wall carbon nanotubes.

Preferably, these single-wall carbon nanotubes are approximately perpendicular to the main plane of the surface of the substrate.

In one advantageous embodiment of the process according to the invention, the steps are carried out simultaneously.

The process according to the invention is actually intermediate between two extreme processes, namely firstly physical vapor deposition (PVD) and secondly chemical vapor deposition (CVD) and forms an excellent compromise between these two techniques, without having any of the disadvantages.

The process according to the invention satisfies the needs mentioned above and solves problems that arise in processes according to prior art, and in particular, unlike single-wall nanotube deposition processes according to prior art, the process according to the invention that implements a particular ECR plasma and a specific substrate, can be used to make depositions on very large areas, for example larger than 1 $m^2$.

Fundamentally, the process according to the invention prevents the use of catalysts, which has the consequence of obtaining very pure nanotubes with a high efficiency, starting from organic compounds only.

Firstly, the process according to the invention uses a particular ECR plasma source which is a confining source due to the use of a magnetic mirror type magnetic structure, preferably unbalanced. The mirror causes confinement in the deposition chamber and therefore dissociation of the gas containing carbon, such as $CH_4$.

Secondly, the ECR electron cyclotron resonance area according to the invention, unlike the situation for most ECR plasma processes, is located inside the deposition chamber or on the border of the deposition chamber, facing the substrate, and is thus either integrated into it or is very close to it. Therefore there is no or very little separation between the ECR plasma reaction chamber and the deposition chamber.

Then in the process according to the invention, said particular and confining ECR plasma source is used at very low pressure, usually less than $10^{-3}$ mbars.

The combination of this particular and confining ECR plasma source and the very low pressure according to the invention, very strongly dissociate organic molecules to obtain single-wall carbon nanotubes; while the specific, profiled substrate used enables the SWNTs to grow outside the surface of the substrate, approximately perpendicular to the main plane of the substrate surface, toward the plasma.

The ECR plasma created according to the invention is a stable and stationary plasma which, once set up, persists and becomes stable. A partial and complete dissociation of the molecules is achieved, eventually causing possible dissociations, and for example in which methane can dissociate to give C° species.

More precisely, it can be said that the life of plasma particles increases.

In other words, this significant magnetic confinement increases the life of ions and electrons that remain trapped in the magnetic mirror at the center of the deposition chamber and along the field lines. Therefore, dissociation and ionization rates of molecules in the plasma are increased by electronic collisions of the following type:

$$CH_4 + e \rightarrow CH_3^+ + H° + e + e$$

$$CH_4 + e \rightarrow CH_3° + H° + e$$

$$CH° + e \rightarrow C° + H° + e, \text{ etc.}$$

The low pressure increases the energy of electrons and reduces recombinations.

Surprisingly, according to the invention, it has been observed that for a pressure not conform with the invention, in other words for a pressure of more than $10^{-3}$ mbars, there is almost no growth of single-wall carbon nanotubes, but on the contrary graphite or diamond grains of different sizes appear, sometimes with graphitic crystal clusters.

Single-wall carbon nanotubes with the structure described above and without a catalyst, have never been obtained using processes according to prior art.

There is also an essential advantage with the process according to the invention, in that the single-wall carbon nanotubes are obtained directly from an organic compound without the need to use a catalyst, for example such as a metal, nickel, cobalt or other.

This is called a protuberance type growth. The specific profiled substrate used in the process according to the invention can surprisingly cause carbon nanotubes to grow approximately perpendicular to the surface of the substrate. Therefore, growth occurs without a catalyst—this is one of the fundamental advantages of the process according to the invention—and preferably on tube tips and protuberances, in other words carbon atoms and ions in the plasma will preferably fix on projections or ends of tubes and not uniformly over the entire surface; the result, particularly due to use of a substrate with a surface containing raised and lowered reliefs (non smooth substrate) leads to perfectly differentiated, non interlocking nanotubes with excellent quality over their entire length (see FIGS. 3 and 4).

According to the invention, the surface of the substrate has raised and/or lowered reliefs. This means that the surface of the substrate includes, for example, trenches and/or gouges and/or scratches and/or grooves and/or ridges and/or corrugations and/or holes and/or cavities, and/or pads and/or spikes and/or projections and/or boss and/or embossments.

The trenches, gouges, scratches, ridges, corrugations, etc., are usually linear and are preferably parallel to each other.

The depth and width of each are usually about ten nm to about ten µm.

The dimensions of the holes and cavities are usually between 10 nm and 10 µm.

The substrate can also be defined as being a substrate for which the surface is profiled or not smooth, and these expressions mean for example that the substrate comprises at least one plane that is approximately perpendicular to the main plane of the surface of the substrate.

The surface of the substrate provided with raised and/or lowered reliefs is usually generally plane.

The pads or upstands are usually in the shape of cubes or parallelepipeds, and their dimensions are from 10 nm to 10 µm.

The raised and/or lowered reliefs may also be in the form of a grid or mesh.

The magnetic mirror type magnetic structure according to the invention is such that the magnetic field is maximum ($B_{max}$) at the microwave injection, and the magnetic field is then minimum ($B_{min}$) at the center of the deposition chamber, and finally the magnetic field raises again on the substrate ($B_{substrate}$).

Preferably, the magnetic mirror is unbalanced.

In other words, there is a large magnetic mirror on the input side, at injection and a smaller magnetic mirror on the output side, in other words at the substrate.

Advantageously, according to the invention, the input side mirror ratio, at the microwave injection and as defined by $r_1 = B_{max}/B_{min}$, is greater than or equal to 4, for example it is equal to about 4.

For example, for a 2.45 GHz wave, ECR=875 G, $B_{max}$=2000 G and $B_{min}$=500 G, giving a ratio $r_1$=4.

With a high mirror ratio of about this value, it is possible to diffuse ionized particles (ions and electrons) to the substrate that is at about 700 G, under the effect of a downwards gradient or a gradient towards the window if it is a high field window (2000 G).

Advantageously, the mirror ratio on the output side, towards the substrate, defined as $r_2 = B_{substrate}/B_{min}$, is greater than or equal to 1.5, for example it is equal to about 1.5.

Preferably according to the invention, the substrate s heated to a temperature of 500° C. to 750° C., preferably from 550 to 700° C., to provide the activation energy necessary for growth.

It will be noted that this temperature is relatively low compared with the processes according to prior art, the result is that in the process according to the invention, the nanotubes can be supported by substrates sensitive to high temperatures which could not be used in prior art.

The substrate may be heated by electronic bombardment and/or external heating, and electrons are electrons from the plasma attracted by the substrate.

The substrate may be chosen from among a large variety of materials for which the deformation temperature is greater than the operating temperature, for example such as glass or silicon.

There is no need for the substrate to be conducting. In any case, the carbon nanotubes will be at the applied potential.

According to the invention, the pressure is usually kept less than or equal to $10^{-3}$ mbars, for example it could be $2 \times 10^{-4}$ mbars, to increase the energy of electrons and to reduce recombinations. The pressure is preferably less than or equal to $10^{-4}$ mbars and even better is equal to $10^{-4}$ mbars.

Pressures less than or equal to $10^{-5}$ mbars may be suitable, but the ion density may then become low.

Gas containing carbon may contain carbon in any form whatsoever; any organic molecule is acceptable.

According to the invention, the gas containing carbon is generally chosen from among alkanes, alkenes and alkynes, for example such as methane, ethane, propane, ethylene, acetylene and mixes of them, possibly to which hydrogen has been added, in all proportions.

Advantageously, the injection of microwave power takes place at a frequency of 2.45 GHz, which is an inexpensive industrial frequency and for which the value of the magnetic field B corresponding to the ECR if of the order of 875 Gauss. This value of the magnetic field is independent of the gas.

The substrate may be positively polarized, for example at between +20 volts and +100 volts, with an electron flux that encourages growth without a catalyst in accordance with the invention, the plasma being grounded.

Another possibility consists of applying a negative polarization to the plasma, for example at −20 volts and −100 volts, the substrate being grounded.

The invention also relates to an electron cyclotron resonance plasma deposition device for carbon nanofiber fabric layers on a catalyst free substrate, said device comprising:
a deposition chamber;
means for creating a magnetic mirror type magnetic structure, preferably unbalanced, in said deposition chamber;
an electron cyclotron resonance area inside or on the border of said deposition chamber and facing said substrate;
means for injecting a microwave power in said deposition chamber;
means for creating a pressure of less than $10^{-3}$ mbars in a gas containing carbon inside said deposition chamber; the surface of said substrate comprises raised and/or lowered reliefs. Preferably, said raised and/or lowered reliefs comprise at least one surface approximately perpendicular to the main plane of the surface of the substrate. This is preferable so that the tubes "separate" from the surface, otherwise there would be an ivy type growth.

The device according to the invention may also include substrate heating means, if the substrate is not sufficiently heated by the electrons in the plasma that bombard the substrate.

The device according to the invention may also comprise means of creating a potential difference between the plasma and the substrate.

As already mentioned, the device according to the invention can be distinguished from other devices according to prior art with ECR plasma, essentially due to the fact that there is no separation between the plasma creation chamber, diffusion and the deposition chamber, since the ECR area is preferably integrated into the deposition chamber or is on its border.

The device according to the invention enables the growth of single-wall nanotubes without a catalyst and at low temperature, namely from 500° C. to 700° C., particularly with methane.

The invention also relates to a substrate for which the surface has raised and/or lowered reliefs, said substrate comprising single-wall carbon nanotubes without a catalyst.

Preferably, the raised and/or lowered reliefs comprise at least one surface approximately perpendicular to the main plane of the surface of the substrate, and the nanotubes are then preferably approximately perpendicular to the main plane of the surface of the substrate.

The raised and/or lowered reliefs may have a concave or convex curved, curvilinear shape.

The single-wall carbon nanotubes according to the invention are of excellent quality over their entire length and are preferably not interlocked due to their position, which is preferably approximately perpendicular to the substrate.

However, they may be grouped in the form of bundles.

Such a layer of single-wall carbon nanotubes, preferably approximately perpendicular to the surface of the substrate, has never been obtained by processes according to prior art and can be prepared for the first time using the process according to the invention without a catalyst, due to the use of a particular confining ECR plasma source, the low pressure used and the particular substrate.

The nanotubes according to the invention are preferably perfectly in order, oriented, non interlocked, unlike in prior art in which they are arranged in a random disordered manner and in which they are also polluted, contaminated by frequently large quantities of the catalyst and/or contaminated by particles of amorphous carbon or soot.

"Catalyst free" means that the nanotubes according to the invention do not have any elements that can be defined as catalysts, these elements essentially being transition metals such as nickel, cobalt and iron, and that these elements are present as traces or as normal impurities.

Nanotubes usually refer to catalyst free single-wall tubes according to the invention with a diameter of from 0.7 to 2 or 3 nm, and up to several nm.

The length of the single-wall nanotubes according to the invention is usually from one or several nm, to one or several μm, for example from 1 nm to 10 μm.

Nanotubes according to the invention, apart from their special structure, have a number of excellent properties which make them perfectly suitable for many applications.

Carbon nanotubes according to the invention are electrical conductors or semiconductors and are refractory.

They are usually resistant to temperatures exceeding 700° C.

Nanotubes are field effect electron emitters with a threshold field of a few V/μm, typically 1-2 V/μm; these are the lowest thresholds that exist.

The nanotubes are also chemically inert at ambient temperature.

Finally, for the first time according to the invention, substrates provided with nanotubes can be produced over a large area, for example 0.25 m² to 1 m² and without a catalyst.

The properties described above are used in many possible applications of single-wall nanotubes, namely nanoconductors, nanosemi-conductors, AFM tips, hydrogen storage, emission of electrons, grafting of biological or non-biological molecules, unlike what was described in document [1].

Three of the main applications of the invention depend on the nature of the relief:
when the surface of the relief is perpendicular to the substrate, it can be used to make nanotips used in flat screens;
if the relief is curved, it may be used to transfer a current between two electrodes, for example for nanoconductor nanoelectric memories;
if the relief is arbitrary, it may be used to store hydrogen on carbon tubes in a fuel cell type application (tube bundle).

One graduation represents 200 nm.

Figure 2:
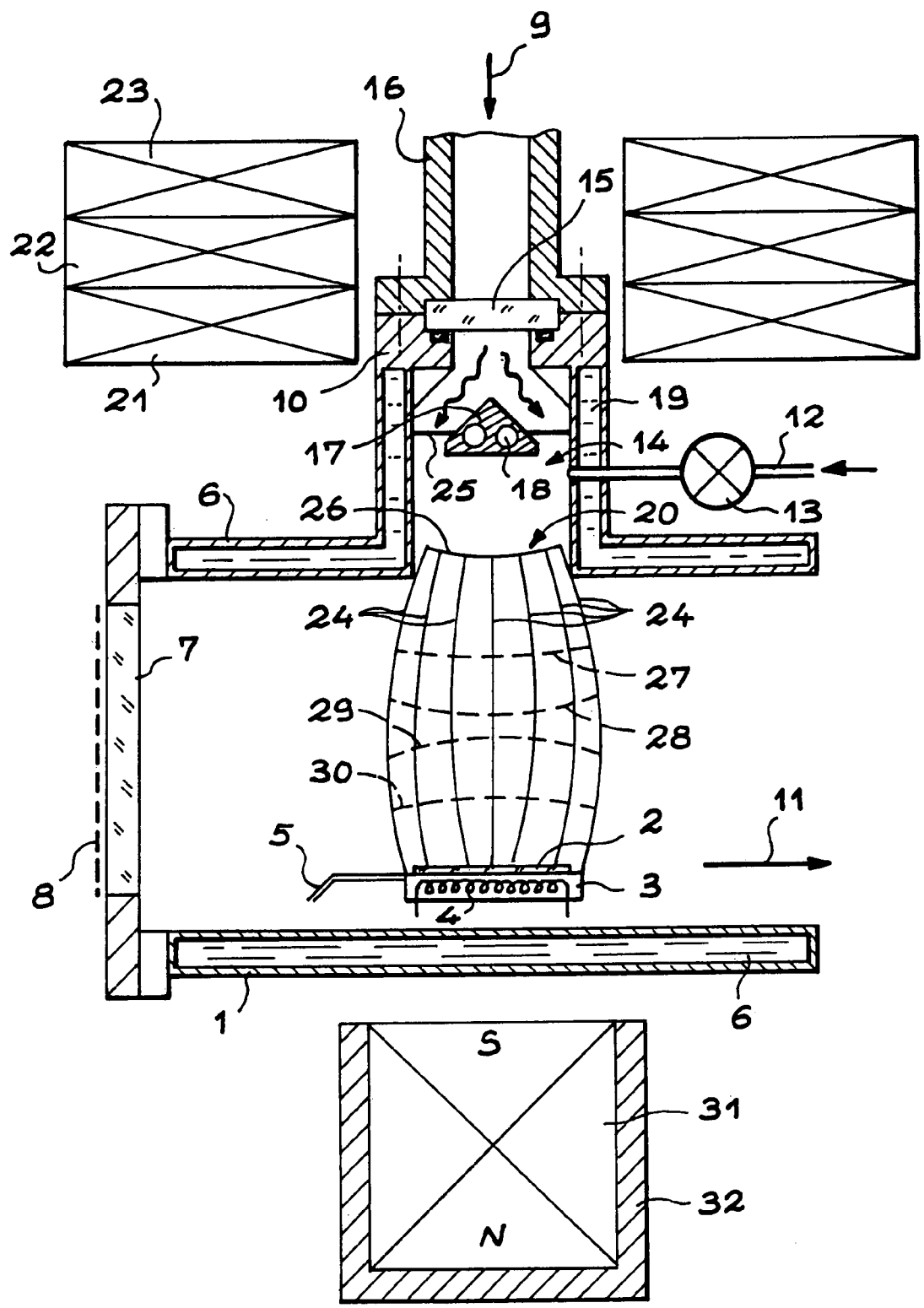
FIG. 2 shows a schematic sectional view of an electron cyclotron resonance plasma source device for implementation of the process according to the invention.

In more detail, the process according to the invention may be used, for example with the device like that shown in FIG. 2.

This device essentially comprises a deposition chamber (1) in which a substrate (2) is located.

This substrate may be fixed or animated, for example by a straight line translation displacement, and the substrate may be positively polarized or it may be grounded.

Preferably, the substrate is positively polarized, usually from +10 to +100 volts, this positive polarization is sufficient to complete the dissociation of organic molecules on the substrate.

The substrate is usually plane and its size is 0.25 m$^2$ to 1 m$^2$, and as we have already seen this is one of the advantages of the invention that will enable the deposition of carbon nanotubes on relatively large areas, for example a 0.25 to 1 m$^2$ or larger substrate, which is particularly attractive for flat screens and wafers for microelectronic.

For example, the substrate may be made of glass, such as a borosilicate, silicon, tantalum or molybdenum type glass.

According to one particularly attractive embodiment, the substrate comprises tungsten.

The substrate may be chosen from among massive tungsten substrates, the substrates composed of a layer of tungsten, for example deposited on silicon, glass and substrates composed of a tungsten grid.

This embodiment is particularly attractive because with such a substrate, the growth efficiency of nanotubes is high, and they grow faster and higher.

According to one essential characteristic of the invention, the surface of the substrate is provided with raised and/or lowered reliefs, in other words it is profiled or not smooth.

The raised and/or lowered reliefs may be of any shape.

However, advantageously, this raised and/or lowered reliefs comprise at least one surface approximately perpendicular to the main plane of the surface of the substrate.

The raised and/or lowered reliefs may also have a concave or convex curved, curvilinear shape.

Therefore, the substrate may preferably be in the form of a plane wafer provided with trenches, gouges, scratches, corrugations, grooves (with corresponding edges), holes, cavities, pads, spikes, projections, boss or embossments, preferably with at least one surface approximately perpendicular to the plane of the substrate, or they may be curved, curvilinear.

The terms microtrenches, microgouges, microholes, etc. will be used because the size of these patterns is usually a few micrometers or fractions of micrometers.

Figure 3:
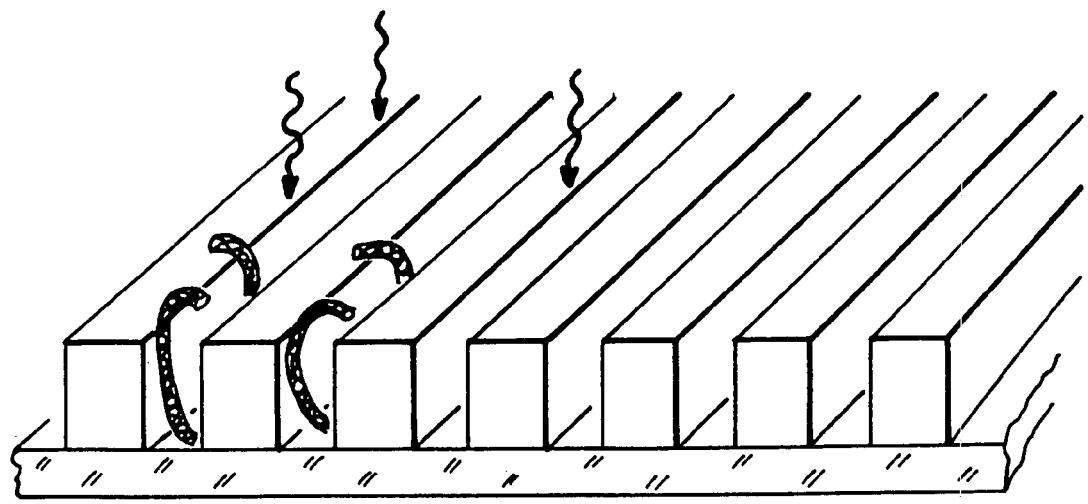
FIG. 3 shows the beginning of the growth of bundles of single-wall carbon nanotubes on a profiled substrate formed from a plane wafer on which scratches, ridges, grooves, corrugations with rectangular cross sections are formed.

Thus, the substrate may be composed of a plane wafer provided with rectangular parallel ridges, for example 10 nm to 1 µm high depending on the use, and 10 nm to 10 µm wide (the height being perpendicular to the plane of the substrate) each ridge being separated by a gutter, groove or a gouge with the same rectangular section, with a depth equal to the height mentioned above and a width varying from 10 nm to a few µm (FIG. 3).

The substrate may also be composed of a plane wafer provided with parallelepiped shaped pads with a width varying from a few nm to a few µm, a length of a few nm to a few µm, and a height from a few nm to a few µm (FIG. 4) (the height being perpendicular to the surface of the substrate).

These pads are usually distributed on a regular pattern, for example a square pattern on the surface of the substrate.

Figure 4:
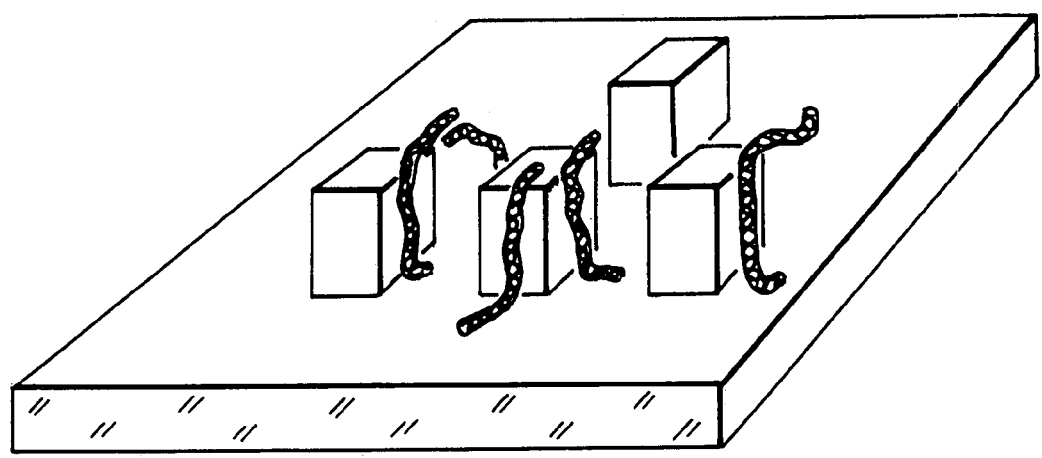
FIG. 4 shows the beginning of the growth of bundles of single-wall carbon nanotubes on a profiled substrate formed from a plane wafer on which micropads are formed.

This type of conformation of the substrate makes it possible to obtain carbon nanotubes in a direction essentially perpendicular to the surface of the substrate, starting from the beginning of growth, as can be seen in FIGS. 3 and 4.

The surface of the substrate may also comprise spikes, for example metallic spikes, or semiconducting spikes distributed uniformly or non-uniformly over the surface of the substrate; these spikes are preferably approximately perpendicular to the main plane of the surface of the substrate.

FIG. 2 shows substrate heating means in the form of a heating substrate carrier (3), for example provided with a heating resistance (4). Furthermore, a thermocouple (5) is provided to measure the temperature of the substrate during the process. The temperature of the substrate is usually from 500 to 750° C.

The deposition chamber or containment in FIG. 2 has an approximately parallelepiped shape for "large area" and "magnetization" applications, and is horizontal, the walls are provided with cooling means in the form of a liner or double wall (6) in which a cooling fluid, preferably water, circulates.

FIG. 2 shows one of the parallelepiped bases forming the deposition chamber, an observation window (7) also equipped with a protective grid (8) for microwaves.

The deposition chamber or containment (1) receives the power generated by one or several microwave emitters (arrow 9) through a coupler (10) that distributes this power in the deposition chamber or containment. The microwave power is usually from 600 to 800 Watts, for example with a frequency of 2.45 GHz.

This injection of microwave power into the containment produces ionization of a low-pressure gas containing carbon.

According to the invention, this is a low pressure, namely as already mentioned above, less than $10^{-3}$ mbars, for example $2 \times 10^{-4}$ mbars.

The low pressure inside the deposition containment or chamber is maintained by pumping as shown by the arrow (11).

The gas containing carbon is injected into the coupler on the input side, for example through a pipe (12) fitted with a regulation and leakage valve (13).

For example, the gas may be chosen from among methane, ethane, ethylene, acetylene and mixes of these gases, possibly together with hydrogen, but methane is preferred.

The coupler (10) comprises a microwave injection guide terminating by a part with a larger cross section (14) that is connected to the deposition chamber or containment perpendicular to it. Note that this injection guide can form an elbow at an angle of 90° to protect the microwave window, although this is not the case shown in FIG. 2.

A microwave leak tightness window (15), for example made of quartz, is placed in the wave guide between the inlet wave guide (16) and said largest part of the section (14) (or the 90° elbow).

This leak tightness window (15) makes the separation between the inlet guide or the injection guide (16) in which air is located at atmospheric pressure and the part with a larger section (14), and the deposition containment or chamber. (1) that is kept under a vacuum by pumping (11).

On the output side of the microwave window, in the part with a larger section (14), there is a protection device (17) for the microwave window that is for example in the form of a part in the shape of a vertical prism that allows microwaves to pass, but that protects the window from a carbon deposit.

This device is also provided with cooling means (18) in the form of pipes through which a cooling fluid such as water can circulate.

The part of the coupler with the largest section is also provided with cooling means, like the deposition chamber, in the form of a lining or double wall (19), possibly connected to the lining of the deposition chamber and in which a cooling fluid such as water can circulate.

In a configuration not shown in FIG. 2, the microwave injection (9) and the leak tightness window (15) are located at 90° from the centerline of the device, so that the leak tightness window is not covered by carbon and enables continuous operation of the device.

Figure 1A:
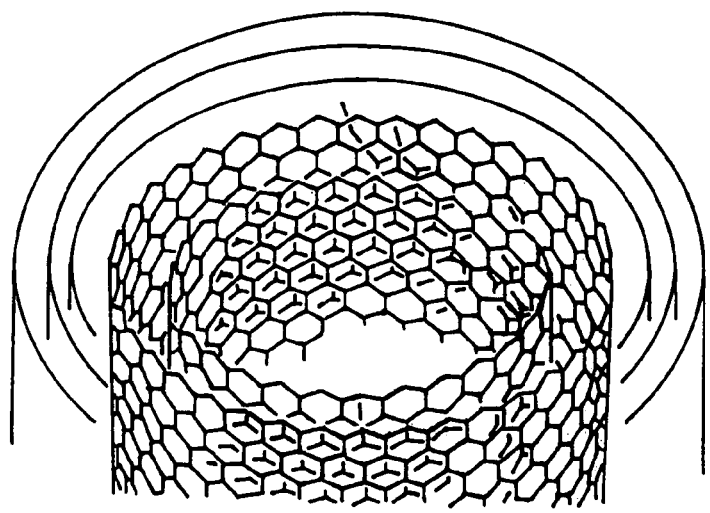
FIG. 1A shows a carbon multi-wall nanotube.
Figure 1B:
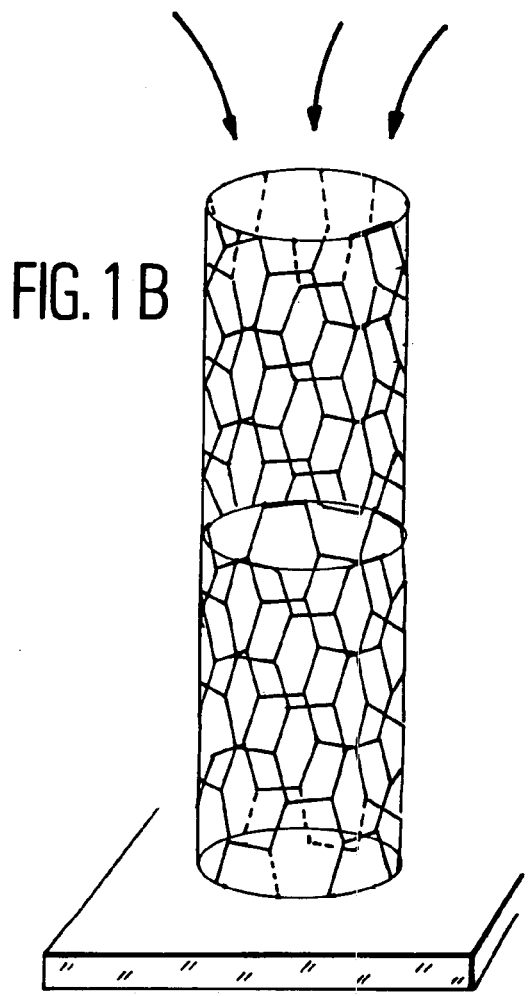
FIG. 1B illustrates a single-wall carbon nanotube.
Figure 1C:
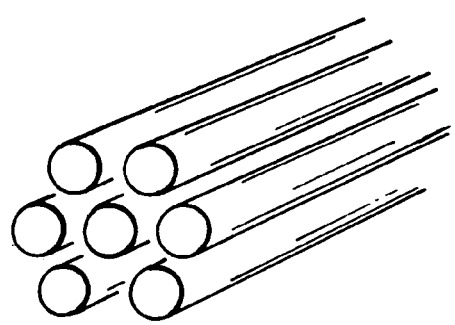
FIG. 1C shows a bundle of single-wall carbon nanotubes.

Advantageously according to the invention, the electron cyclotron resonance area represented as reference (20) in FIG. 1, is located inside the deposition chamber or containment (1) facing the substrate (12).

But the ECR can also be connected at the end of the coupler or slightly inside the deposition chamber.

Consequently, and preferably, in the device according to the invention there is no separation between the plasma creation chamber (ECR), diffusion and deposition chamber since, according to the invention, the ECR area forms part of the deposition chamber.

According to the invention, the microwave power is injected into a specific magnetic mirror type magnetic structure.

This magnetic mirror is preferably unbalanced and comprises the electron cyclotron resonance (ECR) area (20). This ECR area is positioned as described above, preferably inside the deposition chamber (1), but it may also be positioned as shown in FIG. 1, around the border of the deposition chamber which causes dissociation and/or ionization of the molecules composing the gas containing carbon, producing species that will be deposited on said substrate (2).

The electron cyclotron resonance (ECR) magnetic field may be produced by conductor windings such as coils or solenoids with a rectangular, square or cylindrical geometry or by permanent magnets.

In FIG. 2, the magnetic field coils are rectangular magnetic field coils grouped in packets of three (21, 22, 23) on each side of the coupler, in other words the coupler is inside the three rectangular coils.

The dimensions of the deposit depend mainly on the surface of the magnetic field of the electron cyclotron resonance (ECR) created, and diffusion field lines toward the magnet (31). Plasma follows the lines as far as the substrate.

The magnetic system (21, 22, 23) and the flux recovery magnet (31) are in a field addition configuration, in other words fields generated by (21, 22, 23) and (31) are in the same direction in the plasma chamber.

In the case of rectangular magnetic field coils (21, 22, 23) illustrated in FIG. 2, it would for example be possible to obtain a plasma height of 25 cm which can be increased to one meter. In this case (plasma height=1 m), the coils (21, 22, 23) are replaced by permanent magnets, particularly to limit electrical consumption.

According to the invention, the magnetic field created has a particular profile, preferably forming a magnetic structure with an unbalanced magnetic mirror. More generally, the following conditions must be satisfied:
- a mirror with a minimum field B, for example from 500 to 600 G;
- a strong field at the injection, namely at the microwave window, for example close to 2000 G; and
- a medium field on the substrate, for example from 700 to 100 G if the $B_{min}$ field itself is 500 to 600 G.

According to the invention, the important factor is the field profile. To achieve this, the coils are energized with currents to obtain appropriate fields. For example, coils (21), (22) and (23) are powered at 500 A—this current depending on the number of turns in the coils—which gives a $B_{max}$ field of 2000 G at these coils, a $B_{min}$ field of 500 G and a field on the substrate $B_{substrate}$ equal to 750 G.

In this case, the required ratios given above, namely $r_1 \geq 4$, preferably $r_1 \approx 4$ and $r_2 \geq 1.5$, preferably $r_2 \approx 1.5$ are well satisfied. In fact we have $$r_1 = \frac{2000}{500} = 4; \text{ and } R_2 = \frac{700}{500} = 1.5.$$

FIG. 2 shows equimodulus lines of magnetic field (curves or lines 25, 26, 27, 28, 29, 30 shown in dashed lines), in addition to the lines representing the axial magnetic field (curves 24, in continuous lines).

It is seen that the magnetic field is maximum and is high at the microwave injection, where its value is for example equal to 2000 G (25), and it then decreases in the electron cyclotron resonance area (curve 26), where its value is 875 G, and it then goes down to 500 G (27), and the magnetic field is a minimum, for example 500 G to the center of the deposition chamber (28, 29), and the magnetic field then increases firstly up to 600 G (30) and then further to reach a value of 700 to 1000 G on the substrate, for example from 750 G to 800 G.

Therefore we have a magnetic mirror, preferably a relatively large mirror at injection—to protect the microwave window and to reflect ions and electrons towards $B_{min}$—and lower on the output side.

In other words, there must be a mirror, in other words $B_{substrate}$ must be less than $B_{min}$ (for example 750 G>500 G), but this mirror must not be too strong, otherwise ionized species would not reach the substrate.

Typically, the mirror ratio $r_1$ at the injection is equal to approximately 4.

Thus once again, in the case of the device shown in FIG. 2, $r_1 = B_{max}/B_{min} = 2000$ G/500 G=4.

This high mirror ratio $r_1$ means that ionized particles, ions and electrons, can be diffused towards the substrate under the effect of a descending gradient.

Typically, the mirror ratio $r_2$ on the output side towards the substrate is about 1.5.

Thus, in the case of the device in FIG. 1, $r_2 = B_{substrate}/B_{min} = 750\ G/500\ G = 1.5$.

Apart from the coils (21, 22, 23), the mirror and magnetic confinement type magnetic structure in FIG. 2 comprises a permanent magnet (31) placed in a casing or housing (32) located outside the deposition chamber (1) behind the substrate (2) which makes it possible to confine the plasma in the diffusion area. This permanent magnet contains mechanical translation means for adjusting its position along its axis.

For example, the permanent magnet may be made of FeNdB with a remanent field $B_r$, for example 1.33 T.

As already mentioned above, with the significant magnetic confinement according to the invention, it is possible to increase the life of ions and electrons that remain trapped in the magnetic mirror to the center of the deposition chamber and along the field lines.

The dissociation and ionization rates of molecules in the plasma are thus increased with electronic collisions of the following type:

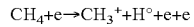

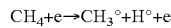

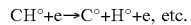

We will now describe the invention with reference to the following example given as an illustrative and non-limitative example.

EXAMPLE

According to the invention, single-wall carbon nanotubes (SWNTs) are deposited on different substrates without a catalyst.

The device used is fairly similar to that shown in FIG. 2.

Figure 6:
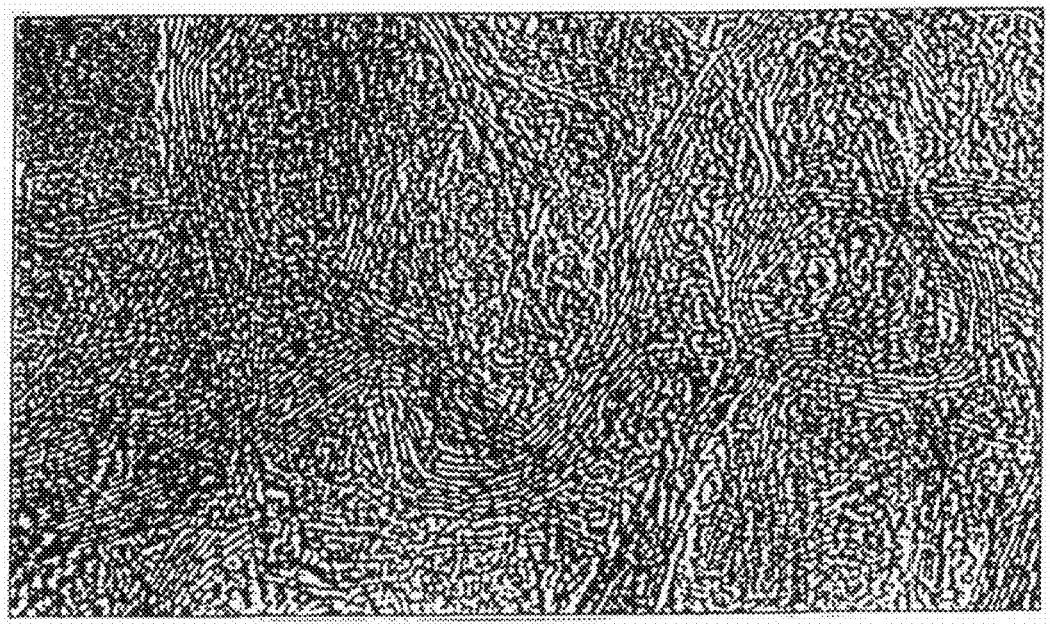
FIG. 6 is an image taken by a transmission electron microscope showing single-wall carbon nanotubes obtained by the process according to the invention without a catalyst with a methane ECR plasma. One graduation represents 10 nm.
Figure 7:
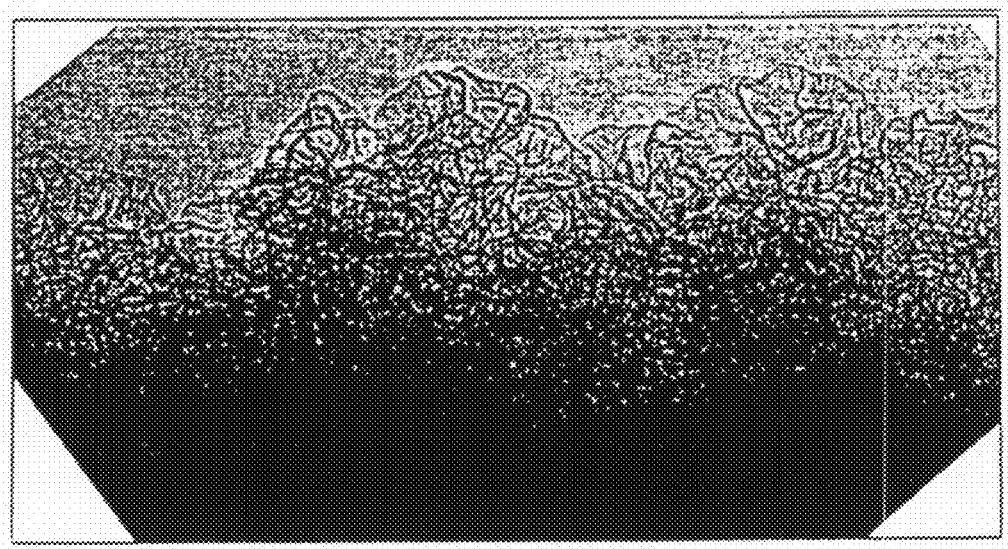
FIG. 7 is an image tangent to the substrate, taken by a transmission electron microscope showing with lower magnification than the image in FIG. 6 that illustrates the growth of bundles of single-wall carbon nanotubes by the process according to the invention without a catalyst, with an ECR plasma starting from a scratched tungsten substrate.

The experimental conditions for synthesis of single-wall carbon nanotubes are as follows:

as used: methane;
methane pressure: $2 \times 10^{-4}$ mbars;
microwave power: 600-800 watts (f=2.45 GHz);
substrate polarization: =70 volts;
electron current on the substrate: 0.8 amperes;
temperature: 560° C.;
deposition duration: 35 and 60 min (two different examples are used, 35 minutes for example 2b and 60 minutes for example 5);
magnetic field: the magnetic field has the profile shown in FIG. 2 with a field of 2000 G at the microwave injection, 875 G at the ECR area, 500 G at the center of the deposition chamber and about 800 G on the substrate;
the substrate is a tungsten substrate, and is corrugated and ribbed as described in FIG. 3 which shows the corrugations, scratches or ribs with a rectangular cross-section, with a depth h of 0.3 µm and a width 1 of 0.1 µm;
FIGS. 6 and 7 are images of nanotubes obtained by the process according to the invention under these conditions, taken with an electronic transmission microscope (TEM).

Figure 5:
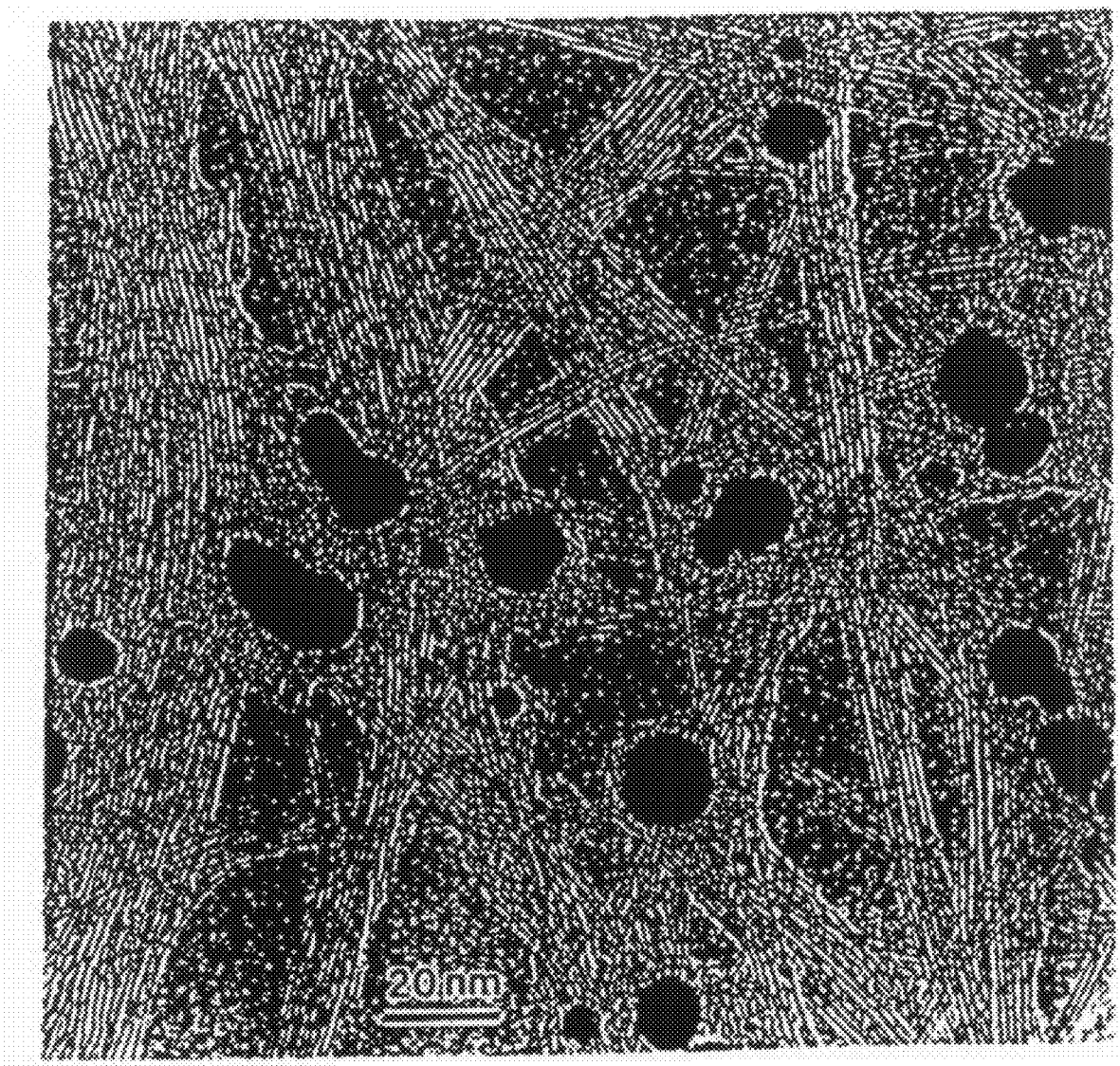
FIG. 5 is an image taken by a transmission electron microscope showing single-wall carbon nanotubes obtained by a process according to prior art with an electric arc using an Rh—Pt catalyst. One graduation represents 20 nm.

The nanotubes that grew perpendicular to the surface (see also FIG. 4) of the substrate are grouped by bundles. Unlike processes according to prior art, they are not catalytic islands as illustrated in FIG. 5 drawn from the SAITO document [5] and showing bundles of carbon nanotubes obtained by an electric arc process with an Rh—Pt catalyst.

FIG. 7, which is a TEM view, shows the same nanotubes as those shown in FIG. 6 but with a smaller magnification and using a view tangent to the substrate, very clearly showing the growth of SWNT bundles starting from the substrate and approximately perpendicular to it.

TABLE 1

Methods of synthesizing single-wall carbon nanotubes

| Reference | Author | Device | Catalyst | Nanotube diameter (nm) |
|---|---|---|---|---|
| [4] | BERNIER, ... | Arc (graphite) | Ni—Co Co—Y | −1.4 nm |
| [5] | SAITO, ... | Arc (graphite) | Rh—Pt (non magnetic) | 0.7-1.3- 1.8 nm |
| [2] | LIU | Arc + $H_2$ (graphite) | Ni, Co, Fe | −1.8 nm |
| [6] | THESS, ... | Laser ablation | Ni, Co | −1.4 nm |
| [7] | CASSELL, ... | $CH_4$ furnace CVD 900° C. | $Al_2O_3$/Fe/ Mo | 0.7 nm to 1.7 nm |
| [8] | NIKOLAEV, ... | Co + $Fe(CO)_5$ 800° C. 1200° C. furnace | Fe | −0.7 nm |
| [1] | KONG, ... | $CH_4$ CVD 1000° C. furnace | Fe | 1 to 3 nm |

REFERENCES

[1] J. KONG et al., Nature, Vol. 395, October 1998, p. 78.
[2] C. LIU et al., Science, 286, (5442), 1127
[3] K. A. DEAN et al., Appl. Phys. Letter, vol. 75, No. 19, Nov. 8, 1999.
[4] C. JOURNET et al., Nature, vol 388, August 1997, p. 756
[5] Y. SAITO et al., Chemical Physics Letters, 294, (1998), 593-598.
[6] A. THESS et al., Science, vol. 273, Jul. 26, 1996, p. 483.
[7] A. M. CASSELL et al., J. Phys. Chem. B, 1999, 103, 6484-6492.
[8] P. NIKOLAEV et al., Chemical Physics Letters, 313, (1999), 91-97.
[9] M. DELAUNAY et al., Rev. of Sc. Instrum., vol 69, N 6, Jun. 1998, Pp. 2320.
[10] M. DELAUNAY et al., Patent EP 99 400164.2/FR 98 00777.
[11] M. DELAUNAY et al., Patent EP 99 401545.1/FR 98 07993.

The invention claimed is:

1. Electron cyclotron resonance (ECR) plasma deposition process for single-wall carbon nanotubes (SWNTs) comprising the following steps:
providing a catalyst-free substrate, which surface includes raised and/or lowered reliefs, in a deposition chamber;
heating the substrate;
injecting microwave power in the deposition chamber, the deposition chamber comprising a magnetic confinement structure with a magnetic mirror, and at least one ECR area inside or at the border of said deposition chamber and facing said substrate, thereby causing dissociation and/or ionization of a gas containing carbon, at a pressure of less than $10^{-3}$ mbars, in said magnetic mirror at the center of the deposition chamber, thereby producing species that will be deposited on said heated substrate; and depositing SWNTs on the catalyst-free substrate.

2. Process according to claim 1, in which the raised and/or lowered reliefs comprise at least one surface approximately perpendicular to the main plane of the substrate surface.

3. Process for deposition according to claim 1, comprising the following steps:

heating the substrate;

creating a pressure of less than or equal to $10^{-3}$ mbars, of a gas containing carbon;

injection of the microwave power and creation of the plasma from said gas containing carbon, for a value of the magnetic field corresponding to electron cyclotron resonance;

creation of a potential difference between the plasma and the substrate;

dissociation and/or ionization of molecules in said magnetic mirror at the center of the deposition chamber; and deposition of the formed species on said substrate to obtain single-wall carbon nanotubes.

4. Process according to claim 1, wherein the magnetic mirror is unbalanced.

5. Process according to claim 1, wherein the magnetic mirror is such that the magnetic field is maximum ($B_{max}$) at the microwave injection, and the magnetic field is then minimum ($B_{min}$) at the center of the deposition chamber, and finally the magnetic field raises again on the substrate ($B_{substrate}$).

6. Process according to claim 1, wherein the input side mirror ratio at the microwave injection, and as defined by $r_1 = B_{max}$ (in Gauss)/$B_{min}$ (in Gauss), is greater than (or equal to) 4.

7. Process according to claim 1, wherein the mirror ratio on the output side, towards the substrate, defined as $Y_2 = B_{substrate}$ (in Gauss)/$B_{min}$ (in Gauss), is greater than or equal to 1.5.

8. Process according to claim 1, wherein the substrate is heated to a temperature of 500° C. to 700° C.

9. Process according to claim 1, wherein the substrate is heated by electronic bombardment and/or external heating.

10. Process according to claim 1, wherein the substrate is positively polarized and the plasma is grounded.

11. Process according to claim 10, wherein the substrate is polarized at between +20 volts and +100 volts.

12. Process according to claim 1, wherein the plasma is negatively polarized and the substrate is grounded.

13. Process according to claim 12, wherein the plasma is polarized at between −20 volts and −100 volts.

14. Process according to claim 1, wherein the surface of the substrate includes trenches and/or gouges and/or grooves and/or ridges and/or corrugations and/or holes and/or cavities and/or pads and/or spikes and/or projections and/or bumps and/or embossments.

15. Process according to claim 1, wherein the substrate comprises tungsten.

16. Process according to claim 15, wherein the substrate is chosen from solid tungsten substrates including a layer of tungsten deposited on silicon or glass, and substrates including a tungsten grid.

* * * * *